United States Patent
Tsao et al.

(10) Patent No.: US 7,443,010 B2
(45) Date of Patent: Oct. 28, 2008

(54) MATRIX FORM SEMICONDUCTOR PACKAGE SUBSTRATE HAVING AN ELECTRODE OF SERPENTINE SHAPE

(75) Inventors: Pei-Haw Tsao, Hsinchu (TW); Chender Huang, Hsin-Chu (TW); Chung-Yu Wang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 1647 days.

(21) Appl. No.: 09/827,106

(22) Filed: Apr. 5, 2001

(65) Prior Publication Data

US 2002/0145178 A1    Oct. 10, 2002

(51) Int. Cl.
*H01L 23/544* (2006.01)
*H01L 23/52* (2006.01)
*H01L 23/48* (2006.01)

(52) U.S. Cl. ............... 257/620; 257/690; 257/692; 257/784

(58) Field of Classification Search ............. 257/620, 257/692, 693, 784, 690, 691, 694–700; 438/113, 438/458, 462, 617; 361/767, 770, 772, 777, 361/778
See application file for complete search history.

(56) References Cited

U.S. PATENT DOCUMENTS 6,121,678 A * 9/2000 Chiu et al. ............ 257/700
6,319,750 B1 * 11/2001 Huang et al. .......... 438/106

FOREIGN PATENT DOCUMENTS

JP          6-204394    *  7/1994

* cited by examiner

*Primary Examiner*—T. Thomas
*Assistant Examiner*—Hung Kim Vu
(74) *Attorney, Agent, or Firm*—Tung & Associates

(57) ABSTRACT

A matrix form semiconductor package substrate that has an electrode situated in-between a plurality of IC package substrates for providing electrical communication to conductive pads on the substrate is provided. The matrix form semiconductor package substrate includes a plurality of IC package substrates that are integrally formed on a strip in a matrix pattern that has a boundary between each two of the plurality of IC package substrates. Each of the plurality of IC package substrates has a multiplicity of conductive pad traces and an electrode, or a plating bar, formed in a serpentine configuration along the boundary for providing electrical communication to the multiplicity of conductive pads.

17 Claims, 4 Drawing Sheets

MATRIX FORM SEMICONDUCTOR PACKAGE SUBSTRATE HAVING AN ELECTRODE OF SERPENTINE SHAPE

FIELD OF THE INVENTION

The present invention generally relates to a matrix form semiconductor package substrate and more particularly, relates to a ball grid array package substrate that has a serpentine-shaped electrode formed thereon for providing electrical communication with a multiplicity of conductive pads during a plating process and a method for forming the package substrate.

BACKGROUND OF THE INVENTION

Ball grid array packages for semiconductor chips have been used extensively in the semiconductor industry. The BGA package utilizes solder balls for establishing electrical interconnections between a chip and a printed circuit board (PCB) and provides a package of high quality and reliability. It has been commonly used in CPU chips in personal computers, in chips of multi-chip modules and in other high I/O chips.

A BGA package can be made more compact in size than other packages, for instance, a plastic quad flat package (PQFP). A BGA package which has an IC chip wirebonded to a substrate can be easily soldered to a printed circuit board by solder balls frequently arranged in an area array. Other benefits can also be achieved by the BGA package, for instance, there are fewer soldering defects in a BGA assembly when compared to the PQFPs and the self-alignment effect of the solder balls. As a result, small misalignments in the mounting position can be automatically corrected by the surface tension of the molten solder during a reflow process.

The BGA package utilizes an area array external electrodes which are normally formed of lead/tin solder balls. The solder balls are placed on a back surface of the package at spacings between about 0.5 mm and about 1.5 mm. The BGA package further supplies higher external pin-count density, larger thermal paths to the package surroundings and improved pre-testability.

A typical BGA package 10 is shown in FIG. 1 in an enlarged, cross-sectional view. The BGA package 10 is constructed by first mounting an IC die 12 to a substrate 14 and then making electrical connections between the two by wirebond 16 which connect chip bond pad and substrate bond finger. The IC die 12 is typically interconnected to a plastic resin molded substrate 14 in a transfer molding process. Solder balls 20 are then attached to the backside 18 of the substrate 14 in a post-molding operation. A plastic molding compound or encapsulant 24 is utilized in the transfer molding process to encapsulate the IC die 12 and the bonding wires 16 with a top surface 22 of the substrate. Inside the substrate 14, thermal via holes 28 are formed to provide shorter and significantly larger thermal paths from the IC die 12 to a mother printed circuit board through the holes 28 and the solder balls 20. In more sophisticated BGA package structures, multi-layer substrate which have broader power planes or ground planes, or both are utilized for low inductance and larger thermal-path connections.

The solder balls 20 can be formed on the bottom side 18 of the substrate by a variety of techniques which include solder-ball attachment and solder-paste screen printing. After the solder balls are formed, a reflow operation usually follows to complete the metallurgical connections.

A plane view of the BGA package substrate is shown in FIG. 2. The substrate 14 is provided with slot openings 26. It should be noted that the top side 22 of the substrate 14 is shown and thus the solder balls 20 are under the substrate 14 and therefore not shown in FIG. 2. The wirebonds 16 connect the die 12 to wirebond fingers and a multiplicity of through holes 30 such that electrical communication can be established with the solder balls 20 located on the opposite side of the substrate 14 when a solder is later filled into the through holes 30. Also shown in FIG. 2 are plating bars 32 which are formed of an electrically conductive metal for providing electrical communication between the substrate conductive traces and the solder ball pads (on the bottom side of the substrate 14, not shown) such that the pads and bond finger 36 can be later electroplated.

FIG. 3 is a plane view of the BGA package substrate 14 of FIG. 2 with the slot openings 26 made to have all substrate traces become electrically insulated after the solder ball pads and bond fingers 36 are electroplated.

In the typical BGA package and substrate shown in FIGS. 1-3, the conductive traces, mostly made of copper, serve as the electrical interconnection between the IC die 12 and the system circuitry. The two ends of the metal traces, i.e. the bond fingers and the solder ball pads (not shown) are exposed in ambient and are not covered by a dielectric layer such as a solder mask applied for surface protection and traces electrical insulation. To protect the exposed surfaces of the metal trace from oxidation, the surfaces are normally plated with Ni/Au. Plating bars 32, 34 connect all the traces and are formed to make the plating process possible. After the plating process is carried out, the plating bars 32, 34 must be removed in order to electrically insulate the conductive traces and the wirebond fingers from each other.

In a thin small BGA package, a substrate 14 is designed in a matrix form to achieve high density packaging. This is shown in FIG. 4. In order to conduct an electroplating process for covering the surfaces of the bond fingers and the solder ball pads with a Ni/Au coating, a plating bar (or a plating bus) 42 is provided in the configuration of a straight line through the boundaries of the plurality of BGA packages 10 such that electroplating of all exposed surfaces of the bond fingers and the solder ball pads is possible. The plating bar 42 which connects all the traces 16 must be removed after the plating process to electrically insulate the traces 16 from each other. The removal of the plating bar 42 is carried out conventionally by sawing with a rotary saw blade at the same time when the BGA packages 10 are singulated from each other.

A rotary saw singulation process is shown in FIG. 5 in a cross-sectional view utilizing a rotary saw 44. It is seen that the rotary saw 44 is equipped with a saw blade 46 to cut through in-between the solder balls 20, the substrate 14 along the plating bar 42 to separate the conductive traces 16. Due to the fabrication limitation of the plating bar 42, as well as the requirement for achieving uniform plating thickness, the plating bar 42 is formed of a minimum width. The rotary saw blade 46 used for package singulation must have a thickness larger than the width of the plating bar 42 in order to completely remove the plating bar from the surface of substrate 14. As a result, a rotary saw blade 46 of a large thickness must be used resulting in difficulty in package dimensional control. A highly accurate rotary saw must also be used for the cutting process and a low throughput resulted due to a necessary slower cutting speed. A further processing difficulty may be caused by an inadequate rotary saw cutting process is the incomplete removal of the plating bar 42 which may lead to electrical shorts between the conductive traces 16. When electrical shorts between the traces or the dies occur, the fabrication yield for the IC dies may be significantly reduced.

It is therefore an object of the present invention to provide a matrix form substrate strip (formed on a substrate) that has an electrode formed in-between a plurality of IC package substrates for an electroplating process which does not have the drawbacks or shortcomings of the conventional matrix form substrate strip.

It is another object of the present invention to provide a matrix form substrate strip that has an electrode situated in-between a plurality of IC package substrate for providing electrical communication to conductive traces situated on the substrate.

It is a further object of the present invention to provide a matrix form substrate strip that has an electrode situated in-between a plurality of IC package substrate for providing electrical communication to a multiplicity of conductive pads and bond fingers situated on the dies during an electroplating process.

It is another further object of the present invention to provide a matrix form substrate strip that has an electrode situated in-between a plurality of IC package substrate wherein the electrode is formed in a serpentine configuration.

It is still another object of the present invention to provide a matrix form substrate strip that has an electrode situated in-between a plurality of IC package substrate wherein the electrode is formed in a corrugated configuration.

It is yet another object of the present invention to provide a matrix form substrate strip that has an electrode situated in-between a plurality of IC package substrate wherein the electrode is formed in a corrugated configuration with each one of two legs of a corrugation electrically connecting an oppositely positioned IC package substrate on either side of the electrode.

It is still another further object of the present invention to provide a matrix form substrate strip that has an electrode situated in-between a plurality of IC package substrate for providing electrical communication to conductive pads during an electroplating process and then removing the electrode completely by a rotary saw blade during a singulation process of the IC package substrate.

SUMMARY OF THE INVENTION

In accordance with the present invention, a matrix form substrate strip that has an electrode situated in-between a plurality of IC package substrate for providing electrical communication to conductive traces situated on the substrate during an electroplating process is disclosed.

In a preferred embodiment, a matrix form substrate strip that has an electrode situated in-between a plurality of integrated circuit package substrate for providing electrical communication to conductive traces situated on a package substrate is provided which includes a plurality of a substrate in a matrix form with a boundary between each two of the plurality of IC substrate, each of the plurality of IC substrates has a multiplicity of conductive traces situated in the substrate; and an electrode formed in a serpentine configuration along the boundary for providing electrical communication to the multiplicity of conductive traces and for providing insulation between the multiplicity of conductive pads after the plurality of IC package are cut along the boundary through the electrode.

In the matrix form substrate strip that has an electrode situated in-between a plurality of IC package substrates, the electrode is a plating bar or a plating bus formed of an electrically conductive material. The plurality of IC package substrates may be at least four IC package substrates arranged in a matrix form. The matrix form substrate strip may be a ball grid array package. The plurality of IC package substrates integrally formed in such a way that traces on adjacent dies at corresponding opposite positions are connected together by the electrode. The multiplicity of conductive pads are connected electrically to a multiplicity of wirebond fingers by a multiplicity of metal traces. The electrode may be formed in a corrugated configuration, or in a corrugated configuration with each one of two legs of a corrugation connected to an oppositely positioned IC package substrate. The electrode provides electrical communication to the multiplicity of conductive pads by electrically connecting to a plating bath.

The present invention is further directed to a ball grid array package substrate that includes an insulating substrate which has a top surface; a multiplicity of conductive traces emanating from each one of the plurality of BGA packages, each of the multiplicity of conductive traces provides electrical communication between a conductive pad and a wirebond finger situated on a BGA package; and an electrode that has a serpentine configuration electrically connected to the multiplicity of conductive traces.

On the ball grid array package substrate, the electrode may be formed in a corrugated configuration, or in a corrugated configuration with each one of two legs of a corrugation connected to a trace of an oppositely positioned BGA package. The electrode may be a plating bar formed of an electrically conductive metal, or a plating bus being connected to a plating bath in an electroplating process. The package substrate may further include a plurality of solder balls formed on a bottom surface of the BGA package substrate. The serpentine configuration may have an amplitude between about 0.3 mm and about 5 mm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a matrix form package substrate that has an electrode formed in-between a plurality of integrated circuit package substrate for providing electrical communication to conductive pads situated on the substrate which includes a plurality IC package substrates in a matrix form with a boundary between each two of the substrates, each of the plurality of IC package substrates has a multiplicity of conductive pads; and an electrode formed in a serpentine configuration, or in a corrugated configuration, along the boundary for providing electrical communication to the multiplicity of conductive pads and for providing insulation between the multiplicity of conductive pads after the plurality of IC package substrates are cut along the boundary through the electrode. The electrode formed in the present invention package substrate may be a plating bar, or a plating bus that is formed of an electrically conductive metal. The matrix form substrate may be a ball grid array package. When the electrode is formed in a corrugated configuration, each one of two legs of a single corrugation is connected to an oppositely positioned IC package substrate. The electrode provides electrical communication to the multiplicity of conductive pads by electrically connecting to a plating bath.

The present invention further discloses a ball grid array package substrate which includes an insulating substrate that has a top surface; a multiplicity of conductive traces emanating from each one of the plurality of BGA package substrates, each of the multiplicity of conductive traces provides electrical communication between a conductive pad and a wirebond finger situated on a BGA package substrate; and an electrode of a serpentine configuration, or a corrugated configuration electrically connected to the multiplicity of conductive traces.

Figure 1:
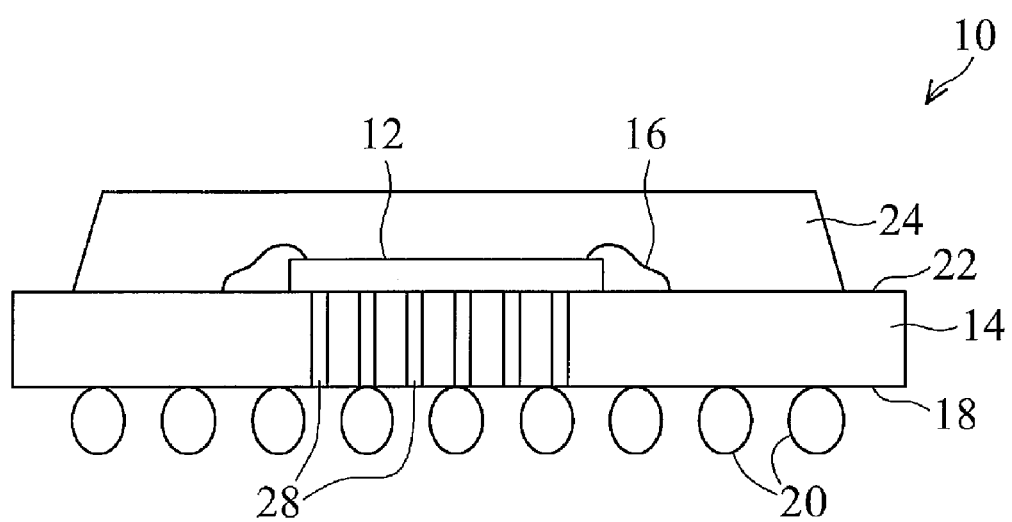
FIG. 1 is an enlarged, cross-sectional view of a conventional BGA package.
Figure 2:
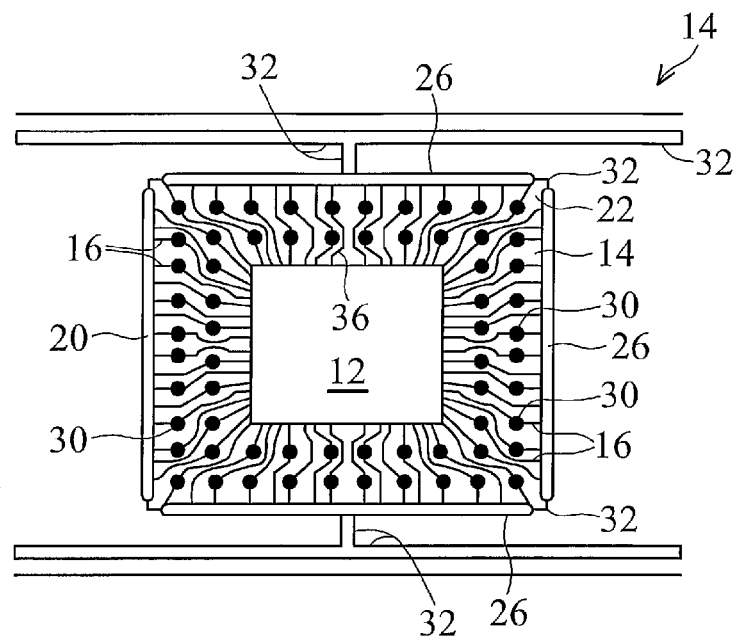
FIG. 2 is a plane view of the BGA package substrate of FIG. 1 with slot openings provided for the removal of plating bars.
Figure 3:
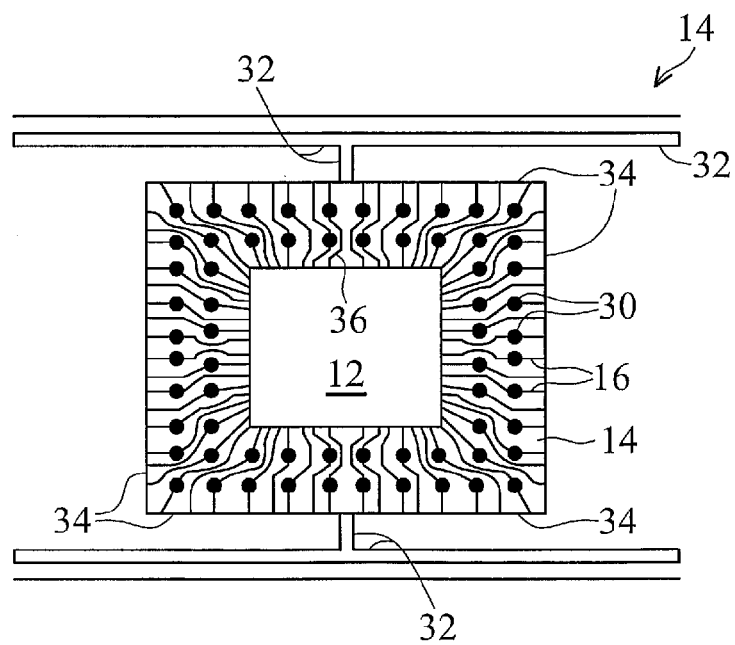
FIG. 3 is a plane view of the BGA package substrate of FIG. 1 with the plating bar formed around the periphery of the package.
Figure 4:
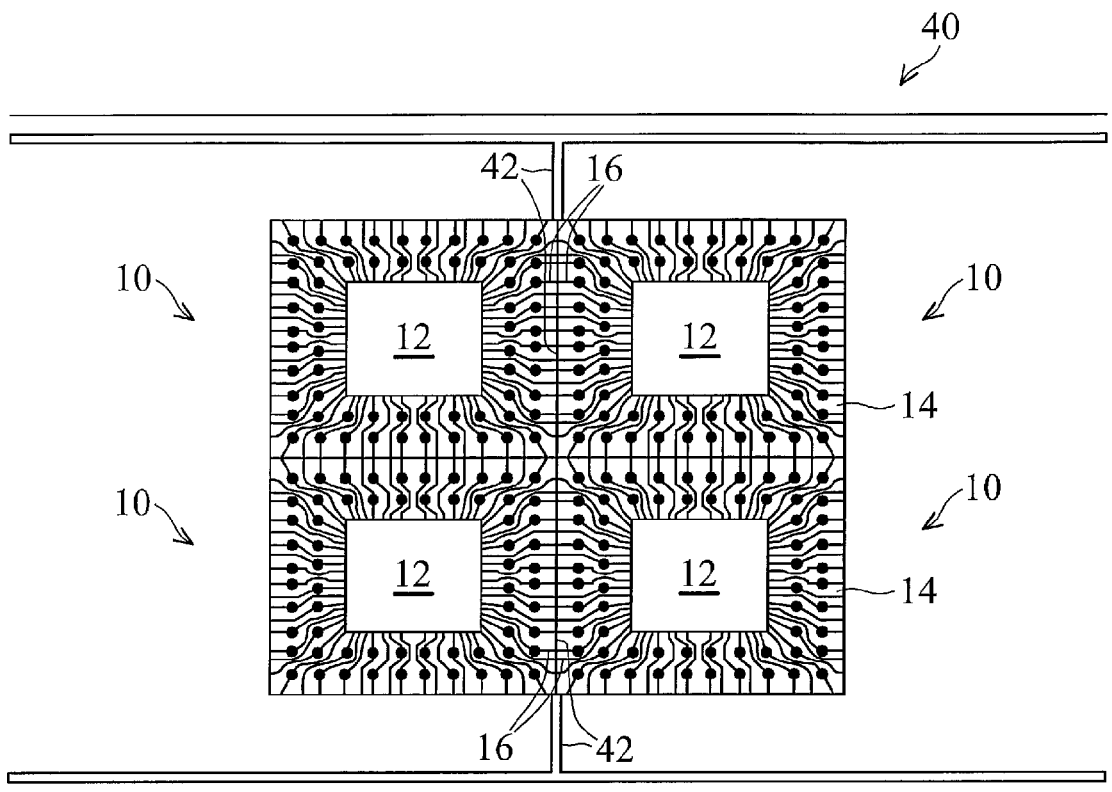
FIG. 4 is a plane view of a matrix form BGA package substrate having a conventional plating bar formed therethrough.
Figure 5:
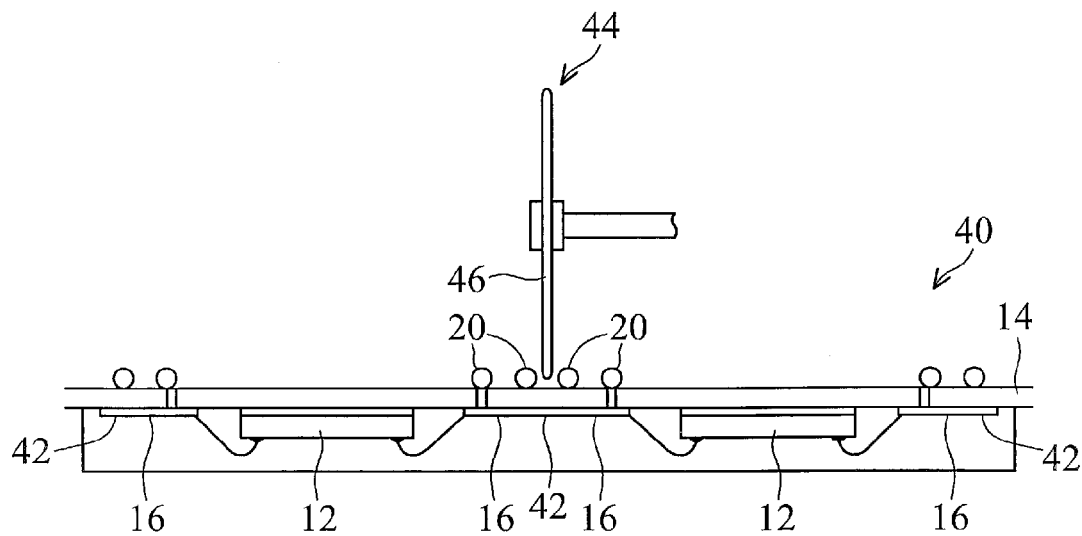
FIG. 5 is a cross-sectional view of a conventional singulation process utilizing a rotary saw blade for the singulation of a BGA package with conventional matrix form substrate strip.
Figure 6:
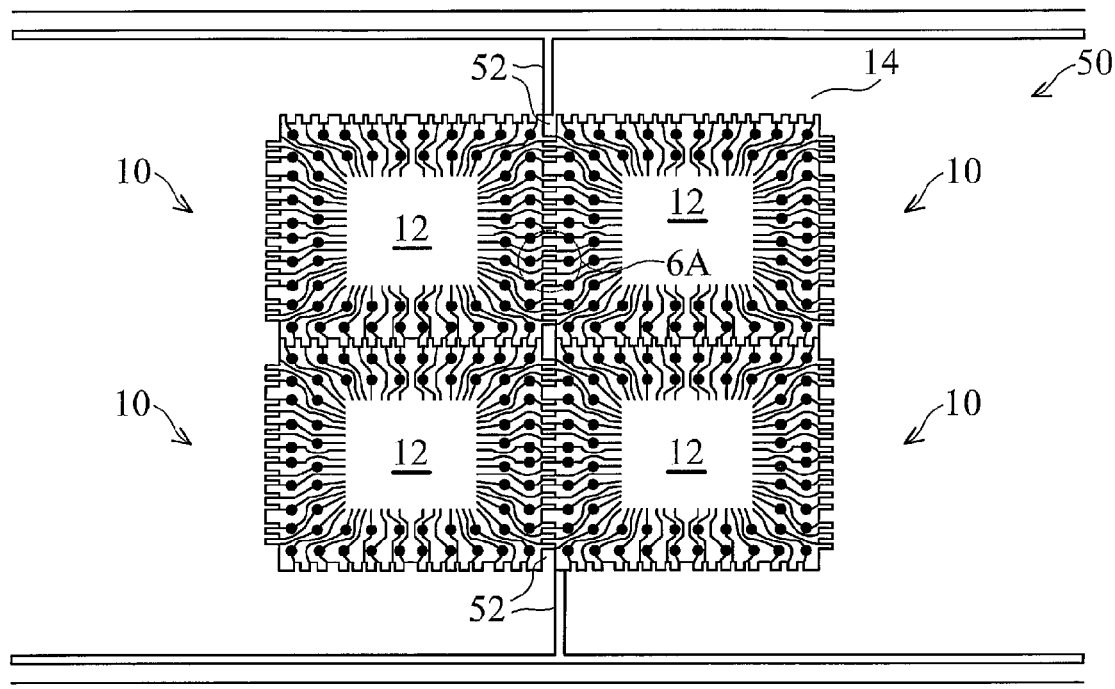
FIG. 6 is a plane view of the present invention matrix form BGA package substrate having a serpentine-shaped plating bar formed in-between the IC package substrate.
Figure 6A:
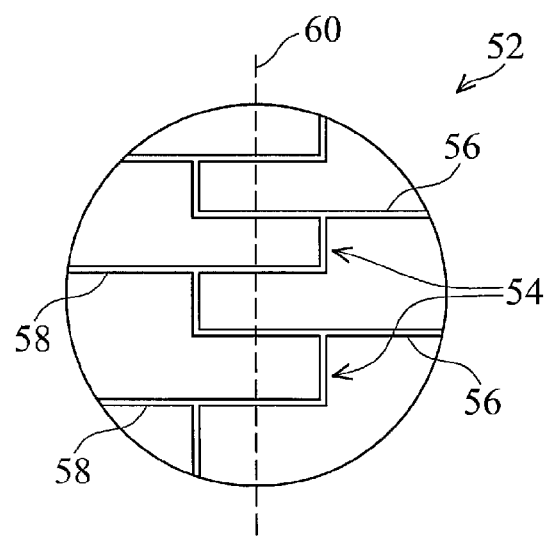
FIG. 6A is an enlarged, partial view of the serpentine-shaped plating bar of the present invention.

The present invention BGA package substrate that has the novel design of a plating bar in a serpentine configuration is shown in FIG. 6. The matrix form BGA package substrate 50 consists of four BGA package substrates 44 which are connected together by a plating bar 52 of serpentine configuration. A detailed, enlarged view of the serpentine configured plating bar 52 is also shown in FIG. 6A. It is seen that for each serpentine, or corrugated shape 54, two legs 56, 58 are provided and are connected respectively to an oppositely positioned BGA package substrate 44. For instance, the leg 56 is connected to the BGA package substrate 44 on the right-hand side shown in FIG. 6, while the leg 58 is electrically connected to the BGA package substrate 44 on the left-hand side of the plating bar 52 shown in FIG. 6.

The present invention plating bar 52 provides a serpentine configuration such that when a saw cut path 60 is created to saw through the corrugated plating bar 52, all the electrical connections by legs 56, 58 are severed and are electrically insulated from each other. Any chances of electrical shorting due to an inadequate cut on a straight line plating bar such as those utilized in the conventional package substrate can be eliminated. It should be noted that the plating bar 52 shown in FIGS. 6 and 6A is in a corrugated shape. However, any other serpentine configuration that does not have straight or 90° corners can also be utilized as long as the saw cut path can efficiently cut through all the serpentine passageways. In other words, as shown in FIG. 6A, the square corners of the corrugations 54 may be curved in a serpentine shape, while serving the same desirable purpose of the present invention.

The present invention novel plating bar design with a serpentine configuration or a corrugation configuration for providing electrical communication to metal traces of different IC package substrates and between adjacent traces on the same substrate can be effectively utilized without causing any possible electrical shorts when compared to a straight line plating bar conventionally used. The possibility of electrical shorting between traces can be avoided during a package singulation process by using a rotary saw blade. The present invention novel design further allows the use of a thinner saw blade since the blade thickness no longer has to be larger than the plating bar thickness. The thinner saw blade used in the present invention singulation process provides improved control in the package dimension and enables a higher throughput. Another advantage made possible by the present invention novel serpentine design of plating bars is that wider plating bars may be designed to provide more uniform plating on the conductive pads and on the wirebond fingers. The wider plating bars may be used since the plating bars are easily severed in a serpentine configuration by a thin rotary saw blade.

The present invention novel matrix form semiconductor package substrate that has an electrode formed in-between a plurality of IC package substrates for providing electrical communication during a plating process wherein the electrode is advantageously formed in a serpentine or a corrugation configuration has therefore been amply described in the above description and in the appended drawings of FIGS. 6 and 6A.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A matrix form semiconductor package substrate having an electrode situated in-between a plurality of integrated circuit (IC) package substrates for providing electrical communication to conductive pads situated on said plurality of IC package substrates comprising:

said plurality of IC package substrates integrally formed on a substrate strip in a matrix form having a boundary between each two of said plurality of IC package substrates, each of said plurality of IC package substrates having a multiplicity of conductive pads; and said electrode formed in a rectangular-shaped, corrugated configuration along said boundary with each one of two legs of a corrugation connected to only one IC package substrate for providing electrical communication to said multiplicity of conductive pads and for providing insulation between said multiplicity of conductive pads after said plurality of IC package substrates are cut along said boundary through said electrode.

2. The matrix form semiconductor package substrate having said electrode situated in-between said plurality of integrate circuit (IC) package substrates according to claim 1, wherein said electrode being a plating bar formed of an electrically conductive material.

3. The matrix form semiconductor package substrate having said electrode situated in-between said plurality of integrate circuit (IC) package substrates according to claim 1, wherein said electrode being a plating bus formed of copper.

4. The matrix form semiconductor package substrate having said electrode situated in-between said plurality of integrate circuit (IC) package substrates according to claim 1, wherein said plurality of IC package substrates being at least four IC package substrates arranged in said matrix form.

5. The matrix form semiconductor package substrate having said electrode situated in-between said plurality of integrate circuit (IC) package substrates according to claim 1, wherein said matrix form semiconductor substrate being for a ball grid array package.

6. The matrix form semiconductor package substrate having said electrode situated in-between said plurality of integrate circuit (IC) package substrates according to claim 1, wherein said plurality of IC package substrates integrally formed in such a way that traces on adjacent package substrates at corresponding opposite positions are connected together by said electrode.

7. The matrix form semiconductor package substrate having said electrode situated in-between said plurality of integrate circuit (IC) package substrates according to claim 1, wherein said multiplicity of conductive pads being connected electrically to a multiplicity of wirebond fingers by a multiplicity of traces.

8. The matrix form semiconductor package substrate having said electrode situated in-between said plurality of integrate circuit (IC) package substrates according to claim 1, wherein said electrode being formed in a corrugated configuration.

9. The matrix form semiconductor package substrate having said electrode situated in-between said plurality of integrate circuit (IC) package substrates according to claim 1, wherein said electrode provides electrical communication to said multiplicity of conductive pads by electrically connecting to a plating bath.

10. The matrix form semiconductor package substrate having said electrode situated in-between said plurality of integrate circuit (IC) package substrates according to claim 1, wherein said serpentine configuration of said electrode having an amplitude between about 0.3 mm and about 5 mm.

11. A ball grid array (BGA) package substrate comprising:
an insulating substrate having a top surface;
a plurality of BGA package substrates formed on said top surface of said insulating substrate;
a multiplicity of conductive traces emanating from each one of said plurality of BGA package substrates, each of said multiplicity of conductive traces provides electrical communication between a conductive pad and a wirebond finger situated on said BGA package substrate; and
an electrode having a rectangular-shaped, corrugated configuration with each one of two legs of a corrugation connected to only one BGA package substrate.

12. The ball grid array package substrate according to claim 11, wherein said electrode being formed in a corrugated configuration.

13. The ball grid array package substrate according to claim 11, wherein said electrode being formed in a corrugated configuration with each one of two legs of a corrugation connected to a trace of an oppositely positioned BGA package substrate.

14. The ball grid array package substrate according to claim 11, wherein said electrode being a plating bar formed of an electrically conductive metal.

15. The ball grid array package substrate according to claim 11, wherein said electrode being a plating bus being connected to a plating bath in an electroplating process.

16. The ball grid array package substrate according to claim 11 further comprising a plurality of solder balls formed on a bottom surface of said BGA package substrate.

17. The ball grid array package substrate according to claim 11, wherein said serpentine configuration having an amplitude between about 0.3 mm and about 5 mm.

* * * * *